United States Patent
Leirens

(10) Patent No.: US 11,131,728 B2
(45) Date of Patent: Sep. 28, 2021

(54) METHOD FOR INITIALIZING A SENSOR ARRAY

(71) Applicant: Commissariat a l'energie atomique et aux energies alternatives, Paris (FR)

(72) Inventor: Sylvain Leirens, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 268 days.

(21) Appl. No.: 16/366,248

(22) Filed: Mar. 27, 2019

(65) Prior Publication Data

US 2019/0302199 A1  Oct. 3, 2019

(30) Foreign Application Priority Data

Mar. 27, 2018 (FR) ...................................... 18 52637

(51) Int. Cl.
*G01R 33/12* (2006.01)
*G06F 3/041* (2006.01)
(Continued)

(52) U.S. Cl.
CPC ......... *G01R 33/1215* (2013.01); *G01D 3/022* (2013.01); *G01R 33/038* (2013.01);
(Continued)

(58) Field of Classification Search
CPC .............. G01R 33/1215; G01R 33/038; G01R 33/0094; G01R 33/12; G01D 3/022; G06F 3/0414; G06F 3/0418; G06F 3/046
See application file for complete search history.

(56) References Cited

U.S. PATENT DOCUMENTS

2006/0012581 A1\* 1/2006 Haim .................... G06F 3/0446
345/173
2008/0158174 A1 7/2008 Land et al.
(Continued)

FOREIGN PATENT DOCUMENTS

FR    2 946 154    12/2010
FR    2 951 280    4/2011
(Continued)

OTHER PUBLICATIONS

French Preliminary Search Report dated Jan. 24, 2019 in French Application 18 52637, filed on Mar. 27, 2018 (with English Translation of Categories of Cited Documents and Written Opinion).

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

A method for initializing a sensor array comprises executing a statistical test on a set consisting of first measurements measured by the sensors of the array, the statistical test being able to detect in the first measurements at least one aberrant measurement caused by a presence of an object, called a disruptor, this disruptor modifying the measured physical quantity nonuniformly, wherein if the execution of the statistical test detects at least one aberrant measurement, then the method comprises signaling the presence of the disruptor, and if the execution of the statistical test does not detect at least one aberrant measurement, then the method comprises acquiring second measurements of the physical quantity, the second measurements being measured by the sensors.

13 Claims, 1 Drawing Sheet

(51) Int. Cl.
    *G01R 33/038*    (2006.01)
    *G06F 3/046*     (2006.01)
    *G01D 3/02*      (2006.01)

(52) U.S. Cl.
    CPC ............ *G06F 3/046* (2013.01); *G06F 3/0414* (2013.01); *G06F 3/0418* (2013.01)

(56) References Cited

U.S. PATENT DOCUMENTS

| | | |
|---|---|---|
| 2010/0162832 A1 | 7/2010 | Brauers |
| 2011/0015889 A1 | 1/2011 | Land et al. |
| 2011/0084692 A1 | 4/2011 | Billeres et al. |
| 2012/0062493 A1 | 3/2012 | Land et al. |
| 2012/0092004 A1 | 4/2012 | Billeres et al. |
| 2012/0323501 A1 | 12/2012 | Sarrafzadeh et al. |
| 2013/0093710 A1 | 4/2013 | Land et al. |
| 2014/0240271 A1 | 8/2014 | Land et al. |
| 2015/0009172 A1* | 1/2015 | Su .......................... G06F 3/044 345/174 |
| 2015/0301216 A1* | 10/2015 | Hautson ................. G01V 3/081 324/247 |
| 2016/0195964 A1 | 7/2016 | Land et al. |
| 2017/0350723 A1 | 12/2017 | Hautson et al. |

FOREIGN PATENT DOCUMENTS

| | | |
|---|---|---|
| WO | WO 2013/144338 A1 | 10/2013 |
| WO | WO 2014/079740 A2 | 5/2014 |
| WO | WO 2014/135421 A1 | 9/2014 |
| WO | WO 2014/180796 A1 | 11/2014 |

\* cited by examiner

METHOD FOR INITIALIZING A SENSOR ARRAY

The invention relates to a method for initializing a sensor array. The invention also relates to a data storage medium for implementing this method and to an apparatus employing this method.

A sensor array typically comprises at least four sensors, the sensors being mechanically joined together and being configured to measure the same physical quantity along at least two non-collinear measurement axes. Generally, each of these sensors is also associated with at least one correction coefficient that allows the measurement of this sensor to be corrected in order to compensate for measurement errors.

During the initialization of such a sensor array, a first measurement of the physical quantity measured by each of the sensors is acquired. This first measurement precedes all the other measurements acquired starting from the turn-on of the sensor array. Ideally, in the presence of a physical quantity that is uniformly distributed over all of the sensors, the first measurements should be identical to one another. Thus, in this ideal case, discrepancies in the measurements of the various sensors are essentially due to measurement errors. The correction coefficient may then be adjusted on the basis of these first measurements so that, after this adjustment, the discrepancies in the measurements of the various sensors are almost zero.

In contrast, if during the initialization of the sensor array, because of the presence of a disruptor, the physical quantity is not uniform, the discrepancies in the measurements of the various sensors are not necessarily due solely to measurement errors. In this case, the first measurements must not be used to adjust the correction coefficients. Specifically, contrary to measurement errors, which are caused by internal characteristics of the sensors, the disruptor may be moved or modified. Thus, following a movement of the disruptor, such as a distancing thereof, the adjusted correction coefficients are then no longer correct and remain incorrect until a new initialization of the sensor array is triggered. In this time interval, the measurements of the sensor array will no longer be reliable and the user of the array is not informed thereof. Thus, it is desirable to increase the reliability of the method for initializing a sensor array in particular with respect to the potential presence of a disruptor.

Prior art is known from US 2008/158174 A1 and US 2017/350723 A1. The initializing method described in US 2008/158174 A1 relates solely to an array of single-axis sensors, i.e. an array in which each sensor has a single measurement axis. The initializing method described in US 2007/350723 A1 only allows the presence of a three-axis magnetometer the measurements of which are saturated to be detected.

The invention aims to provide a more reliable method for initializing a sensor array in which each sensor has at least two measurement axes. Its subject is therefore such a method for initializing a sensor array as claimed in claim 1.

Embodiments of this detecting method may comprise one or more of the features of the dependent claims.

Another subject of the invention is a data storage medium that is readable by a microprocessor, which comprises instructions for executing the method that is one subject of the invention, when these instructions are executed by the microprocessor.

Another subject of the invention is a processing unit for implementing the method that is one subject of the invention.

Another subject of the invention is a system comprising the processing unit that is one subject of the invention.

Embodiments of this system may have one or more of the features of the dependent claims.

The invention will be better understood on reading the following description, which is given merely by way of nonlimiting example and with reference to the appended drawings, in which.

In these figures, the same references have been used to reference elements that are the same.

SECTION I: EXAMPLE EMBODIMENTS

The invention will now be described in the particular case of a system for sensing the trace of the tip of a pencil.

Figure 1:
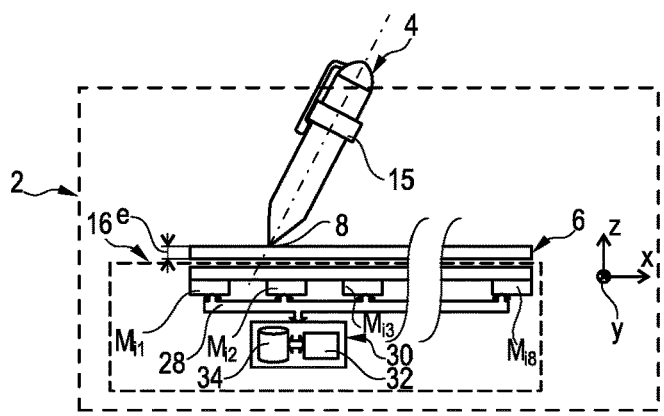
FIG. 1 is a schematic illustration of a system for sensing the trace of the tip of a pencil on a writing medium.

FIG. 1 shows such a system 2 for sensing the trace of the tip 8 of a pencil 4 on a writing medium 6. The architecture of such a system has already been described, for example, in document WO2013144338 A1. Therefore, below, information contained in this document is not repeated here. For more information on the architecture of this known system, the reader may consult this document WO2013144338 A1.

The system 2 comprises an apparatus 16 for locating the tip 8. The pencil 4 is equipped with a permanent magnet 15 fastened with no degree of freedom to the pencil 4.

The apparatus 16 allows the magnet 15, and therefore the pencil 4, to be located in a three-dimensional coordinate system XYZ. By locate, what is meant here is determine the position x, y, z of the magnet 15 in the coordinate system XYZ and also determine the orientation of the magnetic moment of the magnet 15 with respect to the directions X, Y and Z of the coordinate system XYZ.

To this end, the apparatus 16 comprises an array of N sensors. In this example embodiment, each sensor is a three-axis magnetometer Thus, in this embodiment, the physical quantity measured by each of the sensors is the magnetic field. Typically, N is higher than or equal to four or five and, preferably, higher than sixteen or thirty-two. In the example embodiment that will be described, the number N of sensors is equal to thirty-two.

Each magnetometer $M_{ij}$ is connected by way of a bus 28 for transmitting information to an electronic processing unit 30.

The electronic processing unit 30 is capable of determining the position and orientation of the magnet 15 and, from this information, to deduce the position of the tip 8 on the medium 6. To this end, the electronic processing unit 30 comprises a programmable microprocessor 32 able to execute instructions recorded on a data storage medium. The electronic processing unit 30 therefore also comprises a memory 34 containing the instructions necessary for the execution, by the microprocessor 32, of the method of FIG. 4 or 5.

Figure 2:
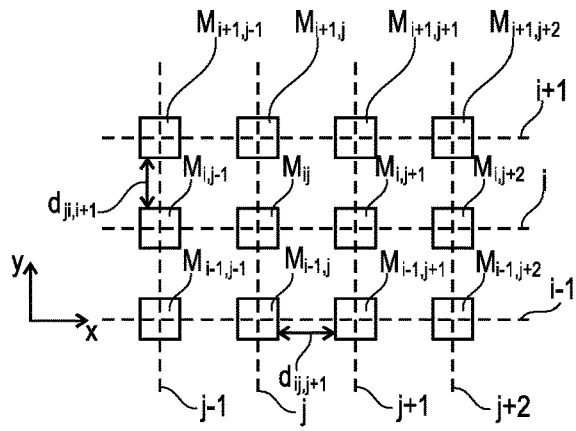
FIG. 2 is a schematic illustration of one portion of a magnetometer array used in the system of FIG. 1.

FIG. 2 shows some of the magnetometers $M_{ij}$ of the apparatus 16. By way of illustration, the magnetometers $M_{ij}$ are aligned in rows and columns in order to form a matrix array. The indices i and j respectively identify the row and the column of this matrix array at the intersection of which the magnetometer $M_{ij}$ is found. Here, to fix the orientation of the magnetometers with respect to one another, each magnetometer $M_{ij}$ is fastened with no degree of freedom to the other magnetometers.

The centers of two magnetometers $M_{ij}$ and $M_{ij+1}$ that are immediately consecutive along a row i are separated by a distance $d_{i,j;j+1}$. Similarly, the center of two magnetometers $M_{ij}$ and $M_{i+1,j}$ that are immediately consecutive along a given column j are separated by a distance $d_{j,i;i+1}$. Here, whatever the row i, the distance $d_{i,j;j+1}$ is the same. This distance is therefore denoted $d_i$. Similarly, whatever the column j, the distance $d_{j,i;i+1}$ between two magnetometers is the same. This distance is therefore denoted $d_j$. In this particular embodiment, the distances $d_i$ and $d_j$ are both equal to d.

Typically, the distance d is comprised between 1 and 4 cm notably when:
the power of the permanent magnet 15 is 0.5 A·m², 
the sensitivity of the magnetometers $M_{ij}$ is $4*10^{-7}T$, and
the number of magnetometers $M_{ij}$ is thirty-two.

Figure 3:
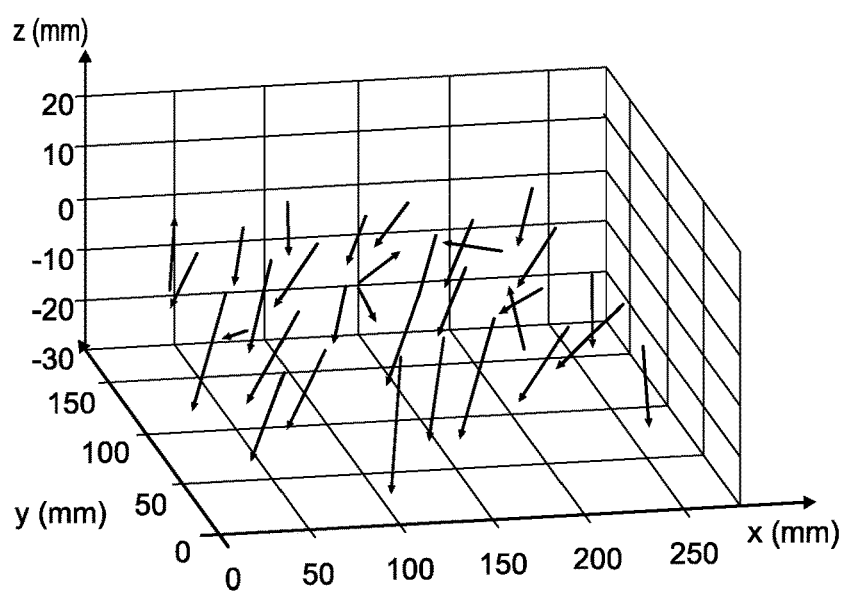
FIG. 3 is a graph showing the magnetic fields measured by the magnetometers of the array of FIG. 2.

FIG. 3 shows in the coordinate system XYZ via thirty-two arrows the first measurements of the magnetometer array. Each arrow represents the direction of the magnetic field measured by one respective magnetometer $M_{ij}$. The length of each arrow represents the strength of the magnetic field measured by the corresponding magnetometer.

The first measurements shown in FIG. 3 were measured only in the presence of the Earth's magnetic field. In particular, during the measurement of these first measurements, no magnetic object, other than the apparatus 16, was located in proximity to the magnetometers $M_{ij}$. By "in proximity to the magnetometers $M_{ij}$", what is meant is a distance, between one of the magnetometers $M_{ij}$ and this magnetic object, that is sufficiently short to modify non-negligibly the measurements of at least one of these magnetometers $M_{ij}$. For example, the measurements of a magnetometer $M_{ij}$ are here considered to be modified non-negligibly if the presence of the magnetic object causes the strength of the magnetic field measured by this magnetometer $M_{ij}$ to vary by at least 1% or by at least 5% with respect to the strength of the magnetic field measured under the same conditions but in the absence of this magnetic object. Below, the magnetic object is referred to as a disruptor.

Thus, it will be understood that during the measurement of the measurements shown in FIG. 3, the magnet 15 is not located in proximity to the magnetometers $M_{ij}$.

Under these conditions, given the small dimensions of the array of magnetometers $M_{ij}$ with respect to the distances over which the Earth's magnetic field varies, it is accepted that the Earth's magnetic field, level with the magnetometers $M_{ij}$, is uniform. Therefore, in theory, the magnetic fields measured by the magnetometers $M_{ij}$ should all be identical to one another. However, as FIG. 3 clearly shows, in practice and before a suitable correction is applied, even when the array of magnetometers $M_{ij}$ is only in the presence of a magnetic field that is uniform over all its area, the magnetic fields measured by the various magnetometers $M_{ij}$ are not identical to one another. This is a result of measurement errors of the magnetometers $M_{ij}$. One portion of these measurement errors may be caused by a lack of reproducibility in the process for manufacturing the magnetometers. Because of this lack of reproducibility, the magnetometers $M_{ij}$ are not strictly identical to one another. These errors also result from the fact that each magnetometer $M_{ij}$ comprises ferromagnetic parts. During use of these magnetometers $M_{ij}$, these ferromagnetic parts are not always exposed to the same magnetic field, and hence there may exist in each of the magnetometers $M_{ij}$ remnant magnetic fields that are not identical from one magnetometer $M_{ij}$ to the next. These remnant magnetic fields shift somewhat the measurement of each magnetometer $M_{ij}$. This shift is known as offset and it, in particular, offsets the amplitude of the magnetic field measured along a measurement axis. For example, in the case of magnetometers $M_{ij}$ of the apparatus 16, it has been observed that the distribution of the offsets of the magnetometers $M_{ij}$ is centered between 70 µT and 80 µT. It has also been observed that a few rare magnetometers $M_{ij}$ have offsets higher than 150 µT or 500 µT.

To correct these measurement errors, each magnetometer $M_{ij}$ is associated with one or more correction coefficients. These correction coefficients are applied to the non-corrected measurements of the magnetometer $M_{ij}$ to obtain a corrected measurement. Typically, the non-corrected measurement of the magnetometer $M_{ij}$ along a measurement axis is combined, by addition and/or multiplication, with one of these correction coefficients in order to obtain the corrected measurement along this measurement axis. The values of these correction coefficients are adjusted, in an initialization phase, so that when the magnetometers $M_{ij}$ are placed in a uniform magnetic field, the measurements of all these magnetometers $M_{ij}$ are identical to within a preset margin of tolerance. Below, when a "measurement" is spoken of without specifying whether it is a question of a corrected measurement or not, it is a question of the corrected measurement.

In the particular embodiment described here, each magnetometer $M_{ij}$ is associated with three distinct correction coefficients, i.e. with one correction coefficient per measurement axis. The value of each of these correction coefficients is determined in order to compensate for the measurement offset along a respective measurement axis. Thus, the corrected measurement of a magnetometer $M_{ij}$ is obtained by adding to each non-corrected measurement on one of its measurement axes, such as one of the axes X, Y, Z defined above, the correction coefficient associated with this magnetometer $M_{ij}$ and with this particular measurement axis. Here, the correction coefficients associated with each magnetometer $M_{ij}$ are for example recorded in the memory 34 and determined by the unit 30 in the initialization phase.

To determine the values of the correction coefficients, it is necessary to ensure that the first measurements of the magnetometers acquired in this initialization phase are not disrupted by a disruptor. Specifically, in this case, it is not possible to correctly initialize the magnetometer array and, in particular, to determine the values of the correction coefficients to be employed to correct the following second measurements. However, as illustrated in FIG. 3, the first measurements acquired in the initialization phase have a large dispersion even in the absence of disruptor, this making it very difficult to detect a disruptor. The process, implemented by the system 2, and that will now be described with reference to the processor of FIG. 4, allows this difficulty to be remedied.

The method starts with a phase 40 of initialization of the array of magnetometers $M_{ij}$. For example, the phase 40 is automatically triggered each time the apparatus 16 is turned on. It may also be triggered at regular intervals or in response to the acquisition by the unit 30 of a particular command transmitted, for example, by the user.

The phase 40 starts with a step 42 of automatically detecting the presence in proximity to the magnetometers $M_{ij}$ of a disruptor, i.e. a magnetic object that modifies nonuniformly the magnetic field measured by the magnetometers $M_{ij}$. This nonuniform modification of the measured magnetic field caused by the presence of the disruptor modifies the measurements measured by at least one magnetometer along, generally, its three measurement axes. This therefore in particular causes a variation $\Delta V_1$ in the amplitude measured by a first magnetometer $M_{ij}$ along a first measurement axis. This modification also causes a variation $\Delta V_2$ in the amplitude measured by a second magnetometer $M_{ij}$ along the same first measurement axis. The second magnetometer is different from the first magnetometer. Each variation $\Delta V_1$ and $\Delta V_2$ represents the difference between the amplitudes measured along the first measurement axis in the presence and in the absence of the disruptor. Since the disruptor modifies the measured magnetic field nonuniformly, there is in the array of magnetometers $M_{ij}$ at least two magnetometers for which the discrepancy between the variations $\Delta V_1$ and $\Delta V_2$ is substantial. For example, the discrepancy is considered to be substantial if the following condition is met: $|\Delta V_1 - \Delta V_2| > \rho \times \text{Max}(|V_1|, |V_2|)$, where the symbol "| . . . |" designates the absolute value, the symbol "Max( . . . , . . . )" designates the function that calculates the maximum of the values between parentheses, the symbol "x" designates the operation of multiplication, $V_1$ and $V_2$ designate the amplitudes measured along the first measurement axis, by the first and second magnetometers, respectively, $\rho$ is a constant higher than 0.01 and, preferably, higher than 0.05 or 0.1 or 0.3 or 0.5.

Here, $\rho$ is equal to 0.1 for example.

In the phase 40 of initialization of the magnetometer array, the first measurements are the measurements corrected with the values of the correction coefficients determined in a preceding execution of the phase 40 or with default values recorded in the memory 34, for example during the manufacture of the apparatus 16. The default values are independent of the measurements measured by the magnetometers $M_{ij}$. For example, the default values of the correction coefficients are used if it is the first execution of the phase 40 or following a command to reset the correction coefficients to default values.

The step 42 starts with an operation 44 in which the magnetometers $M_{ij}$ each measure the magnetic field currently present. In this step, the processing electronic unit 30 acquires these first measurements, then, for example, corrects them using preceding values of the correction coefficients recorded in the memory 34. Since each magnetometer $M_{ij}$ has three measurement axes, the unit 30 acquires three first measurements for each magnetometer i.e. a first measurement along each of the measurement axes. These three first measurements of a magnetometer $M_{ij}$ form a first measurement vector. Here these corrected first measurements are then recorded in a matrix A of size (n, p), where:

n is the number of rows and it is here equal to the number N of magnetometers $M_{ij}$ of the array, and p is the number of measurement axes of each magnetometer $M_{ij}$, i.e. here three.

Each row k of the matrix A comprises the three first measurements acquired along the three measurement axes of one particular magnetometer $M_{ij}$. In other words, each row k comprises the three components of the first measurement vector of this magnetometer $M_{ij}$. Below, a particular magnetometer $M_{ij}$ is designated by the reference $M_k$. Thus, in the rest of this description, one particular magnetometer of the array of the apparatus 16 may equally well be designated by the reference $M_{ij}$ as by the reference $M_k$. Here, the index k is the order number of the row of the matrix A and it is therefore comprised between 1 and N. More precisely, each row k comprises in order:

the measurement $MM_{k,x}$ of the orthogonal projection of the magnetic field measured by the magnetometer $M_k$ on the measurement axis parallel to the direction X, the measurement $MM_{k,y}$ of the orthogonal projection of the magnetic field measured by the magnetometer $M_k$ on the measurement axis parallel to the direction Y, and the measurement $MM_{k,z}$ of the orthogonal projection of the magnetic field measured by the magnetometer $M_k$ on the measurement axis parallel to the direction Z, The measurements $MM_{k,x}$, $MM_{k,y}$ and $MM_{k,z}$ present in a given row k correspond, respectively, to the three components of the first measurement vector of the magnetometer $M_k$.

Here, the measurements acquired during the operation 44 are called "first measurements" because they correspond to the first measurements acquired after turn-on of the apparatus 16 or following a particular command, such as a command to reset the values of the correction coefficients. These first measurements are intended to then be used to adjust the new values of the correction coefficients. Thus, these first measurements may have a substantial dispersion, as shown in FIG. 3.

The following operations of step 42 are executed by the unit 30 and correspond to the execution of a statistical test on the first measurements.

In this embodiment, in an operation 46, for each measurement axis, a reference value for the amplitude of the magnetic field measured along this axis is calculated. More precisely, in the operation 46, here, a mean magnetic field, denoted $X_m$ below, is calculated. The components of the mean magnetic field $X_m$ along the directions X, Y and Z are denoted $X_{m,x}$, $X_{m,y}$ and $X_{m,z}$, respectively. Each component $X_{m,x}$, $X_{m,y}$ and $X_{m,z}$ is a mean value of the measurements $MM_{k,x}$, $MM_{k,y}$ and $MM_{k,z}$, respectively, for k varying from 1 to N. Thus the component $X_{m,x}$ is calculated using the following relationship:

$$X_{m,x} = \frac{1}{N}\left(\sum_{k=1}^{k=N} MM_{k,x}\right)$$

The components $X_{m,y}$ and $X_{m,z}$ are calculated similarly. The components $X_{m,x}$, $X_{m,y}$ and $X_{m,z}$ are reference values calculated in the operation 46 for measurement axes parallel to the directions X, Y and Z, respectively. These three components $X_{m,x}$, $X_{m,y}$ and $X_{m,z}$ correspond to the three components of what is here referred to as a "reference vector".

Next, in operation 48, for each magnetometer $M_k$, a distance $d_k$ representative of the discrepancy between the measurements $MM_{k,x}$, $MM_{k,y}$ and $MM_{k,z}$ of this magnetometer $M_k$ and the reference values $X_{m,x}$, $X_{m,y}$ and $X_{m,z}$, respectively, is calculated. Here, the distance used is the Mahalanobis distance.

To do this, a centered matrix $X_c$ of size (n, p) is determined by modifying each component of the matrix A using the mean magnetic field $X_m$. More precisely, to construct the first column of the matrix $X_c$, the reference value $X_{m,x}$ is subtracted from each of the components $MM_{k,x}$ contained in the first column of the matrix A. A similar process is used to construct the second and third columns of the matrix $X_c$ but using, respectively, the reference values $X_{m,y}$ and $X_{m,z}$.

Next, a covariance matrix S is constructed using the following relationship $S=(X_c^T X_c)/(N-1)$. In this text, the exponent "$T$" designates the transpose matrix operation. The matrix S thus obtained is a matrix of size (p, p) that is invertible. The Mahalanobis distance $d_k$ of each magnetometer $M_k$ is then calculated, for example, using the following relationship: $d_k^2 = X_{c,k} S^{-1} X_{c,k}^T$ where $X_{c,k}$ is the kth row of the matrix $X_c$ and the exponent "$-1$" indicates that it is a question of the inverse of the matrix S.

It will be noted that the distance $d_k$ thus calculated depends on the discrepancy between the norms of the first measurement vector and of the reference vector but also on the angular discrepancy between the directions of the same vectors. The norm of a vector is here defined as being equal to sqrt($x^2+y^2+z_z^2$), where:
 sqrt(..) is the function that returns the square root of the number between parentheses, and
 x, y and z are the components of the vector.

In an operation 50, it is verified whether the calculated distances $d_k$ meet a preset condition. If the calculated distances $d_k$ meet this preset condition, then the presence of aberrant measurements is detected and therefore the presence of a disruptor is detected. In this case, the presence of a disruptor in proximity to the magnetometer array is signaled. In one particular embodiment, there follows a step in which the one or more sensors the measurements of which are disrupted are identified and signaled.

In contrast, if the calculated distances $d_k$ do not meet this preset condition, then the presence of aberrant measurements and therefore of a disruptor is not detected. In other words, if the distances $d_k$ do not meet this preset condition, the absence of disruptor is detected. In the latter case, the signal indicating the presence of a disruptor is inhibited.

The preset condition is for example recorded in the memory 34 during the manufacture of the apparatus 16. This preset condition is designed to effectively discriminate between an intrinsic nonuniformity and an extrinsic nonuniformity. By "intrinsic nonuniformity", what is meant here is a nonuniformity in the first measurements of the magnetometers $M_{ij}$ that is caused by elements intrinsic to the apparatus 16, i.e. elements that are fixed with no degree of freedom to the array of magnetometers $M_{ij}$. For example, typically, it is a question of parts made of ferromagnetic material such as the ferromagnetic parts that are located in each of the magnetometers $M_{ij}$.

By "extrinsic nonuniformity" what is meant here is a nonuniformity in the first measurements of the magnetometers $M_{ij}$ that is caused by the disruptor, i.e. by an element exterior to the array of magnetometers $M_{ij}$ and generally exterior to the apparatus 16. The disruptor is here generally a movable magnetic object that may be freely moved with respect to the apparatus 16. For example, the disruptor may be the magnet 15 of the pencil 4 if the latter is in proximity to the array of magnetometers $M_{ij}$ during the execution of the phase 40 of initialization of the magnetometer array.

In this embodiment, the preset condition used is the following: $S_{d1} \geq \alpha_1 S_{Td1}$, where:
 $S_{d1}$ is the sum of the $N_1$ largest computed distances $d_k$,
 $S_{Td1}$ is the sum of all the computed distances $d_k$, and
 $\alpha_1$ is a preset coefficient higher than 0 and lower than 1.
Below, this condition is called "condition 1)".

$N_1$ is a preset number recorded in the memory 34. The number $N_1$ is higher than or equal to one and lower than $N_{dmax}$, where $N_{dmax}$ is equal to the number of distances $d_k$ computed i.e. here to N. Preferably, $N_1$ is lower than or equal to $N_{dmax}/2$ or $N_{dmax}/3$. Preferably, $N_1$ is also higher than or equal to two or three. Here, $N_1$ is chosen equal to ten or eleven.

The coefficient $\alpha_1$ allows the sensitivity of the detection of the presence of a disruptor to be adjusted. In practice, when $N_1$ is chosen to be lower than or equal to $N_{dmax}/2$ or $N_{dmax}/3$, $\alpha_1$ is chosen to be higher than or equal to 0.5 or to 0.7. Here, $\alpha_1$ is equal to 0.7.

It has been discovered that condition 1) is, among the set of possible conditions presented at the end of this description, the one that allows the presence or absence of a disruptor to be most reliably detected.

In this respect, the following trials have been carried out using the pencil 4 as disruptor:
 Trial 1): the pencil 4 is placed horizontally in any location on the face of the magnetometer array then step 42 of detecting the presence of a disruptor is executed.
 Trial 2): the pencil 4 is placed along an edge of the magnetometer array parallel to the X or Y direction then step 42 of detecting the presence of a disruptor is executed.
 Trial 3): the pencil 4 is held vertical, the tip 8 bearing against any location on the medium 6, then step 42 of detecting the presence of a disruptor is executed.

Each of trials 1) to 3) was reiterated several times with the position of the pencil 4 modified each time while respecting the conditions of the trial. In the case of trial 1, the true positive rate (TPR) and the false positive rate (FPR) were both equal to 100%. In the case of trial 2, the TPR was higher than 99.6% and the FPR lower than 0.3%. In the case of trial 3, the TPR was higher than 50% or 70% depending on the apparatus 16 used and the FPR was lower than 0.2%.

If condition 1) is met, the magnetometers $M_k$ identified as being disrupted by the presence of the disruptor are, for example, the $N_1$ magnetometers the distances $d_k$ of which are the largest.

If at the end of the step 42 of detecting the presence of a disruptor, the presence of no disruptor has been signaled, the adjustment of the correction coefficients on the basis of the first measurements acquired in the measurement operation 44 is permitted. Thus, the method continues with a step 52 of automatically adjusting the correction coefficients of the magnetometers $M_{ij}$.

For example, in step 52, for each magnetometer $M_k$, the new values of the three correction coefficients associated with the directions X, Y and Z, respectively, are corrected by subtracting therefrom the measurements $MM_{k,x}$, $MM_{k,y}$ et $MM_{k,z}$, respectively. Thus, below, each new corrected measurement is obtained using these new values of the correction coefficients. These new measurements are called "second measurements" below. This has the consequence of compensating not only for measurement errors but also for the Earth's magnetic field as measured in the measurement operation 44. Thus, after the step 52 of adjusting the correction coefficients, in the absence of disruptor, the corrected second measurements of the magnetometers $M_{ij}$ are all zero to within a preset margin of tolerance.

At the end of the step 52 of adjusting the correction coefficients, the initialization phase 40 is over and the method continues with a phase 58 of use of the second measurements, here, to sense the trace of the tip 8 of the pencil 4.

If at the end of the step 42 of detecting the presence of a disruptor, the presence of a disruptor has been signaled, in response to this signal, the adjustment of the correction coefficients on the basis of the first measurements acquired in the measurement operation 44 is prevented. To do this, the execution of the step 52 of adjusting the correction coefficients is inhibited. For example, in a first embodiment, the use of the magnetometer array is blocked and the execution of the phase 58 of use of the second measurements is prevented. In a second embodiment, in response to the signal indicating the presence of a disruptor:

the method returns to step 42 of detecting the presence of a disruptor, or the method continues with the phase 58 of use of the second measurements but using the correction coefficients adjusted in a preceding execution of the step 52 of adjusting the correction coefficients or using the default values of these correction coefficients.

The phase 58 of use of the second measurements is for example carried out as described in patent application WO2013144338. Therefore, this phase 58 is not described in more detail here and the reader is referred to the text of this patent application for more information. In this phase 58, second measurements of the magnetometers are acquired at regular intervals by the unit 30 then corrected using the correction coefficients. Next, only the second measurements thus corrected are used to determine the position and orientation of the magnet 15 and therefore the position of the tip 8.

Figure 4:
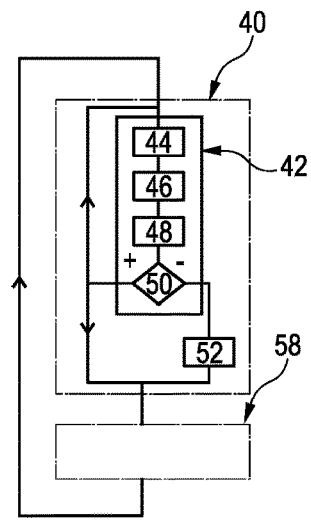
FIG. 4 is a flowchart of a method for sensing the trace of the tip of a pencil on a writing medium using the system of FIG. 1.
Figure 5:
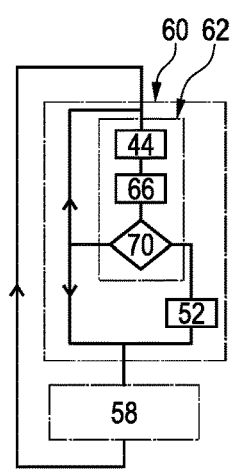
FIG. 5 is a flowchart of a variant of the method of FIG. 4.

FIG. 5 shows another method for sensing the trace of the pencil 4 capable of being implemented in the apparatus 16 instead of the method of FIG. 4. The method of FIG. 5 is identical to the method of FIG. 4 except that the initialization phase 40 has been replaced by a phase 60. The phase 60 is identical to the phase 40 of initialization of the magnetometer array except that step 42 of detecting the presence of a disruptor is replaced by a step 62 of detecting a disruptor. Step 62 is identical to step 42 of detecting the presence of a disruptor except that:

the operations 46 for computing a reference value and 48 for computing the distance $d_k$ are replaced by an operation 66, and the operation 50 for verifying the preset condition is replaced by an operation 70.

In the operation 66, for each magnetometer $M_k$, the unit 30 computes the strength $B_k$ of the magnetic field measured by this magnetometer from the measurements $MM_{k,x}$, $MM_{k,y}$, $MM_{k,z}$ acquired in the measurement operation 44. Conventionally, the strength $B_k$ is computed using the following relationship: $B_k$=sqrt($MM_{k,x}^2$+$MM_{k,y}^2$+$MM_{k,z}^2$), where sqrt (..) is the function that returns the square root of the number between parentheses.

The operation 70 is identical to the operation 50 for verifying the preset condition except that condition 1) is then expressed, for example, in the following form: $S_{B1} \geq \alpha_1 S_{TB1}$, where:

$S_{B1}$ is the sum of the $N_1$ highest strengths $B_k$ among the set of the computed strengths $B_k$, $S_{TB1}$ is the sum of all the computed strengths $B_k$.

SECTION II: VARIANTS

Section II.1. Variants of the Distance $d_k$

Other methods may be used to calculate a distance representative of the discrepancy between the measurements of one sensor and the measurements of the other sensors. For example, in the operation 48 of computing the distance $d_k$, the mean magnetic field $X_m$ may be replaced by a median magnetic field. In this case, the reference values $X_{m,x}$, $X_{m,y}$ and $X_{m,z}$ are equal to the median value, instead of the mean value, of the measurements measured along the measurement axes X, Y, Z.

The distance may also be computed using reference values other than a mean or median value. For example, a reference value may be set equal to the maximum or minimum of the measurements of the N sensors along a measurement axis.

There are also other methods for calculating the Mahalanobis distance $d_k$. For example, the unit 30 carries out a principal component analysis (PCA) in order to determine three directions u, v and w of maximum variance forming an orthonormal basis. Next, the distance $d_k$ is calculated using the following relationship $d_k^2 = y_k^2 L^{-1}$, where:

$y_k$ is the kth row of a matrix Y of size (n, p) that each contain orthogonal projections of the vector $X_{c,k}$ onto the axes u, v and w, respectively, and L is the vector the components of which are formed by the eigenvalues of the covariance matrix S.

The Mahalanobis distance may be replaced by another distance such as for example, a Euclidean distance.

As a variant, the first measurements used are directly the raw measurements of the magnetometers without any correction applied thereto.

Section II.2. Variants of the Preset Condition:

Preset conditions other than condition 1) described above may be used. For example, condition 1) may be replaced by one of the following conditions:

Condition 2): if $N_2$ distances $d_k$ are higher than a preset threshold $S_2$, then the presence of a disruptor is detected, where $N_2$ is higher than or equal to one and lower than or equal to $N_{dmax}$. Preferably, the threshold $S_2$ is computed depending on $\mu_d$ and $\varepsilon_d$, where:

$\mu_d$ is the mean value of the computed distances $d_k$, and $\varepsilon_d$ is the standard deviation of the distribution of the computed distances $d_k$ about the value $\mu_d$.

For example, the threshold $S_2$ is computed using the following relationship: $S_2 = \mu_d + \beta_d \varepsilon_d$, where $\beta_d$ is a preset constant.

Condition 3): if $N_3$ distances $d_k$ are higher than a preset threshold $S_3$, then the presence of a disruptor is detected, where $N_3$ is higher than or equal to one and lower than or equal to $N_{dmax}$. Preferably, the threshold $S_3$ is computed depending on $\mu_m$ and $\varepsilon_m$, where:

$\mu_m$ is the median value of the computed distances $d_k$, and $\varepsilon_m$ is the maximum absolute deviation (MAD).

For example, the threshold $S_3$ is computed using the following relationship: $S_3 = \mu_m + \beta_m \varepsilon_m$, where $\beta_m$ is a preset constant.

The various conditions described here may be used whatever the method used to compute the distance. They may also easily be adapted to the case where the distance $d_k$ is replaced by another quantity such as the strength $B_k$.

Other preset conditions may for example be generated by combining using logic operators a plurality of the conditions 1) to 3) described above. For example, as a variant, the preset condition is: "condition 1)" OR "condition 2)" where "condition 1)" and "condition 2)" are conditions 1) and 2) described above, respectively.

Section II.3. Other Variants:

In a simplified version, in operation 44, the first measurements do not undergo a first correction using the preceding values of the correction coefficients or the default values of these correction coefficients.

In another embodiment, when a disruptor is detected at the end of step 42 of detecting the presence of a disruptor, the method continues with an automatic step of signaling the presence of this disruptor. For example, in this signaling step, the unit 30 controls a human-machine interface in order to signal to a user of the apparatus 16 the presence of a disruptor in proximity to the sensor array. For example, the unit 30 requests a written message to be displayed or an audio message to be played in order to signal the presence of a disruptor. This message may also request the user to distance the disruptor from the apparatus 16 during the initialization phase.

For the implementation of the initialization phase, it is not necessary for the distances between the magnetometers to be known. It is also not necessary for the magnetometers to be fastened to one another with no degree of freedom. For example, as a variant, the mechanical links between the magnetometers permit a translational movement of the magnetometers with respect to one another while preventing any rotational movement of the magnetometers with respect to one another.

As a variant, if the orientations with respect to one another of the measurement axes of the magnetometers $M_{ij}$ are known, then it is not necessary for the measurement axes of these various magnetometers $M_{ij}$ to be parallel to one another. Specifically, via a simple change of coordinate system, the unit 30 is capable of converting the measurements along the measurement axes of a given magnetometer into measurements carried out, for example, along the directions X, Y and Z of the coordinate system XYZ.

The various variants of the structure of the system that are described in document WO2013144338 are applicable to the structure of the system 2 described here. Likewise, the various variants of the method for sensing the trace of a pencil that are described in document WO2013144338 are applicable here.

The array of magnetometers $M_{ij}$, and therefore the initialization phase 40 or 60, may be used in apparatuses other than an apparatus for sensing the trace of a pencil. For example, the initialization method described here may also be implemented in the apparatuses described in the following documents: WO2014135421, WO2014079740 and WO2014180796.

Many other embodiments of the step 52 of automatically adjusting the correction coefficients are possible. For example, in another embodiment, the correction coefficients of the magnetometers $M_{ij}$ are adjusted so as to compensate only for measurement errors without compensating for the Earth's magnetic field. To do this, by way of illustration, for each magnetometer $M_{ij}$, the three correction coefficients associated with the directions X, Y and Z, respectively, are set equal to $MM_{k,x}-X_{m,x}$, $MM_{k,y}-X_{m,y}$ and $MM_{k,z}-X_{m,z}$, respectively.

What has been described here in the particular case where the sensors are magnetometers applies to any array of sensors with at least two measurement axes. In particular, it applies to sensor arrays measuring a physical quantity other than the magnetic field. For example, the physical quantity measured by the sensors of this other array may be a force, a pressure, a velocity or an acceleration. Thus, what has been described applies to arrays of force sensors or pressure sensors, to accelerometer arrays or to gyrometer arrays or any other type of sensor array.

What has been described here also applies to any sensor array in which each sensor comprises more than three non-collinear measurement axes or, conversely, only two non-collinear measurement axes. In particular, what has been described here applies to arrays of pressure sensors in which each sensor is able to measure the pressure in a normal direction and a shear force in a direction orthogonal to this normal direction. For example, such a sensor is described in document US20100162832A1.

Condition 1) may be implemented even if the computed distance is not both dependent on the discrepancy between the norms of the measurement and reference vectors and on the angular discrepancy between the same vectors. For example, condition 1) may be implemented in the case where the computed distance depends only on the discrepancy between the norms of the measurement and reference vectors or only on the angular discrepancy between the measurement vector and the reference vector.

SECTION III: ADVANTAGES OF THE DESCRIBED EMBODIMENTS

The fact of detecting aberrant measurements in the first measurements allows the presence of a disruptor to be signaled. Thus, the absence of reliability of the first measurements is signaled so that corrective or preventive measures may then be implemented in order not to exploit the unreliable first measurements. For example, as described above, when the presence of a disruptor is signaled, the adjustment of the correction coefficients on the basis of the first measurements is inhibited. Operation of the sensor array may also be prevented. In addition, the computed distance $d_k$ is both dependent:
  on the discrepancy between the norms of the first measurement vector and of the reference vector, and
  on the angular discrepancy between the first measurement vector and the reference vector, Thus, if a disruptor modifies solely the direction of the first measurement vector without modifying the norm thereof, this will be able to be detected. This is advantageous with respect to methods that simply compare the norm of the first measurement vector to the norm of the reference vector in order to detect the presence of an aberrant measurement. Thus, the initialization method described here is more sensitive and therefore more reliable.

The fact of using a distance between what a sensor measures and a reference value for this measurement allows the false positive rate and the false negative rate to be limited with respect to an identical method that uses directly the amplitude or the norm of the measured physical quantity and not a distance with respect to a reference value.

The fact of using condition 1) allows the false positive rate and the false negative rate to be limited with respect to other possible conditions, such as for example the conditions 2) and 3) described above.

The fact of using the Mahalanobis distance also allows the reliability of the detection of the presence of a disruptor to be increased with respect to other methods that are identical but that use another distance, such as for example the Euclidean distance.

The fact of using pre-recorded values to adjust the correction coefficients when a disruptor is detected allows an adjustment of the sensors to be obtained that is better than the adjustment that would be obtained if the adjusting step were executed in the presence of this disruptor with correction coefficients calculated in the presence thereof. This therefore limits degradations in the operation of the sensor array.

The invention claimed is:

1. A method for initializing a sensor array comprising at least four sensors, the sensors being mechanically joined together and being configured to measure the same physical quantity along at least two non-collinear measurement axes, the method comprising:
  acquiring first measurements of the physical quantity, the first measurements being measured by the sensors and preceding second measurements, the first measurements of the sensors along each of corresponding measurement axes forming a first measurement vector, executing a statistical test on a set consisting of the first measurements measured by the sensors, this statistical test being able to detect in the first measurements at least one aberrant measurement caused by a presence of an object, called a disruptor, the disruptor modifying a measured physical quantity nonuniformly, if the execution of the statistical test detects at least one aberrant measurement, then the method comprises signaling the presence of the disruptor, if the execution of the statistical test does not detect at least one aberrant measurement, then the method comprises acquiring second measurements of the physical quantity, the second measurements being measured by the sensors, wherein the execution of the statistical test comprises:
for each measurement axis, computing a reference value for the first measurements of the sensors, the reference values computed for each measurement axis forming a reference vector, for each sensor, computing a distance representative of a discrepancy between the first measurement vector of this sensor and the computed reference vector, the distance depending on:

a discrepancy between norms of the first measurement vector and of the reference vector, and an angular discrepancy between the first measurement vector and the reference vector, and verifying that the computed distances meet a preset condition and detecting a presence of at least one aberrant measurement if the computed distances meet the preset condition and, conversely, when the computed distances do not meet this preset condition, not detecting at least one aberrant measurement.

2. The method as claimed in claim 1, wherein the method comprises identifying and signaling at least one sensor having measured an aberrant measurement.

3. The method as claimed in claim 1, wherein the preset condition is the following condition: $S_{d1} \geq \alpha_1 S_{Td1}$, where:

$S_{d1}$ is a sum of $N_1$ largest computed distances, where $N_1$ is a number higher than or equal to one and lower than or equal to $N_{dmax}/2$ or $N_{dmax}/3$, where $N_{dmax}$ is equal to the number of computed distances, $S_{Td1}$ is a sum of all the computed distances, and $\alpha_1$ is a preset coefficient higher than zero and lower than one.

4. The method as claimed in claim 1, wherein the computed distance is the Mahalanobis distance.

5. The method as claimed in claim 1, wherein the computation of the reference value comprises computing a mean or median value of the first measurements.

6. The method as claimed in claim 1, wherein:
if the execution of the statistical test does not detect at least one aberrant measurement, the method comprises adjusting correction coefficients depending on the first measurements in order to compensate for sensor measurement errors, each sensor being associated with at least one of the correction coefficients, then correcting the second measurements using these adjusted correction coefficients, then using the corrected second measurements in any subsequent steps exploiting the second measurements.

7. A non-transitory data storage medium that is readable by a microprocessor, wherein the medium comprises instructions for the execution of a method according to claim 1, when the instructions are executed by the microprocessor.

8. A processing unit for implementing an initializing method as claimed in claim 1, this processing unit being configured to:

acquire the first measurements of the physical quantity, the first measurements being measured by the sensors and preceding second measurements, the first measurements of the sensors along each of corresponding measurement axes forming the first measurement vector, execute the statistical test on the set consisting of the first measurements measured by the sensors, the statistical test being able to detect in the first measurements at least one aberrant measurement caused by the presence of the disruptor, the disruptor modifying the measured physical quantity nonuniformly, if the execution of the statistical test detects at least one aberrant measurement, then signaling the presence of the disruptor, and if the execution of the statistical test does not detect at least one aberrant measurement, then acquiring second measurements of the physical quantity, the second measurements being measured by the sensors, wherein the processing unit is also configured to, during the execution of the statistical test, carry out the following operations:

for each measurement axis, compute the reference value for the first measurements of the sensors, the reference values computed for each measurement axis forming the reference vector, for each sensor, compute the distance representative of the discrepancy between the first measurement vector of this sensor and the computed reference vector, the distance depending on:

the discrepancy between the norms of the first measurement vector and of the reference vector, and the angular discrepancy between the first measurement vector and the reference vector, verify that the computed distances meet the preset condition and detect the presence of at least one aberrant measurement if the computed distances meet the preset condition and, conversely, when the computed distances do not meet the preset condition, establish the absence of at least one aberrant measurement.

9. A system comprising:
the sensor array comprising at least four sensors, the sensors being mechanically joined together and being configured to measure the same physical quantity along at least two non-collinear measurement axes, and the processing unit according to claim 8.

10. The system as claimed in claim 9, wherein each sensor is chosen from the group consisting of a magnetometer, a pressure sensor, a force sensor, an accelerometer and a gyrometer.

11. The system as claimed in claim 9, wherein each sensor comprises at least a first measurement axis and a second measurement axis, the first measurement axes being parallel to one another and the second measurement axes being parallel to one another.

12. The system as claimed in claim 9, wherein each sensor is a three-axis magnetometer or a two-axis pressure sensor.

13. The system as claimed in claim 12, wherein:
the system comprises at least one permanent magnet able to be fastened with no degree of freedom to a pencil, each sensor of the sensor array is able to measure an amplitude of the magnetic field along at least three non-collinear measurement axes, and the processing unit is able to sense a trace drawn by the pencil on a writing surface, the processing unit being configured to locate the at least one permanent magnet fastened to the pencil and to deduce, from the location of the at least one permanent magnet, a position of a tip of the pencil.

* * * * *